(12) United States Patent
Edouard et al.

(10) Patent No.: US 10,748,073 B2
(45) Date of Patent: Aug. 18, 2020

(54) METHOD AND DEVICE FOR ASSOCIATING A STATE TO A NEW VALUE OUTPUT BY A DRIFTING SENSOR

(71) Applicant: WITHINGS, Issy les Moulineaux (FR)

(72) Inventors: Paul Edouard, Malakoff (FR); Riu-Yi Yang, Coignieres (FR); Cedric Hutchings, Brookline, MA (US)

(73) Assignee: WITHINGS, Issy les Moulineaux (FR)

( * ) Notice: Subject to any disclaimer, the term of this patent is extended or adjusted under 35 U.S.C. 154(b) by 970 days.

(21) Appl. No.: 15/164,329

(22) Filed: May 25, 2016

(65) Prior Publication Data
US 2017/0344894 A1    Nov. 30, 2017

(51) Int. Cl.
| | |
|---|---|
| *G06F 17/00* | (2019.01) |
| *G06N 5/02* | (2006.01) |
| *G06N 7/00* | (2006.01) |
| *H03M 7/30* | (2006.01) |
| *G01L 1/26* | (2006.01) |

(52) U.S. Cl.
CPC ............... *G06N 7/005* (2013.01); *G01L 1/26* (2013.01); *H03M 7/3064* (2013.01)

(58) Field of Classification Search
CPC ......... G01L 1/26; G06N 7/005; H03M 7/3064
See application file for complete search history.

(56) References Cited

U.S. PATENT DOCUMENTS

| | | | | |
|---|---|---|---|---|
| 4,926,674 A | * | 5/1990 | Fossum | G01L 19/02 73/1.62 |
| 5,521,846 A | * | 5/1996 | Lang | B60C 23/0408 702/130 |
| 6,490,515 B1 | * | 12/2002 | Okamura | B60N 2/002 180/273 |
| 2003/0202709 A1 | * | 10/2003 | Simard | G06K 9/00442 382/243 |
| 2004/0075569 A1 | * | 4/2004 | Ohtaka | B60N 2/002 340/667 |

(Continued)

OTHER PUBLICATIONS

"An Efficient Forward-Backward Algorithm for an Explicit-Duration Hidden Markov Model" Shun-Zheng Yu and Hisashi Kobayashi, Fellow, IEEE (Year: 2003).*

(Continued)

*Primary Examiner* — Luis A Sitiriche
(74) *Attorney, Agent, or Firm* — Miller, Matthias & Hull LLP

(57) ABSTRACT

The present invention relates to a method of associating at least one state in a plurality of states to a new value output by a drifting sensor, the method comprising: /a/ receiving a signal from the sensor, said signal comprising a plurality of values; /b/clustering the values of said signal into a number of clusters equal to the number of the plurality of states, each cluster being associated with a respective state in the plurality of states; /c/ for the new value of the signal, associating at least one state in said plurality of states or a probability rating representing the probability to be associated with one state in said plurality of states for said new value of the signal, the associated state or the associated probability rating being determined based on at least distances ($d_H$, $d_L$) of said new value of the signal to respective clusters.

19 Claims, 6 Drawing Sheets

(56) References Cited

U.S. PATENT DOCUMENTS

| | | | | |
|---|---|---|---|---|
| 2010/0305816 | A1* | 12/2010 | Orlewski | B60R 21/01516 701/45 |
| 2010/0325132 | A1* | 12/2010 | Liu | G06F 16/24568 707/759 |
| 2011/0222584 | A1* | 9/2011 | Michaels | H04J 13/0018 375/130 |
| 2012/0246102 | A1* | 9/2012 | Sudharsan | G06N 7/005 706/25 |
| 2012/0253233 | A1* | 10/2012 | Greene | G16H 50/30 600/592 |
| 2017/0167939 | A1* | 6/2017 | Kastelein | G01L 27/005 |

OTHER PUBLICATIONS

"Classification and regression trees" pp. 41-63 L. Wilkinson in SYSTAT 11: Statistics I.SYSTAT Software, Inc., Richmond, Calif. (Year: 2004).*

Yu; "*An efficient Forward-Backward Algorithm for an Explicit—Duration Hidden Markov Model*"; IEEE Processing Letters, vol. 10, No. 1; Jan. 2003; article.

Leland Wilkinson; "*Classification and Regression Trees*"; www.cda.psych.uiuc.edu, Aug. 2013; chapter 3; pp. 41-63.

Hartigan, et al; "*A K-Means Clustering Algorithm*"; Journal of Royal Statistical Society; vol. 28, No. 1; pp. 100-108; 1979.

International Search Report related to Application No. PCT/EP2017/062442 dated Aug. 4, 2017.

"Cluster analysis", Wikipedia, May 14, 2016 (May 14, 2016), XP002772388, Retrieved from the Internet: URL:https://en.wikipedia.org/w/index.php?title=Cluster_analysis&oldid=720209845[retrieved on Jul. 21, 2017] the whole document specifically first paragraph and figures.

"Moving average", Wikipedia, May 13, 2016 (May 13, 2016), XP002772389, Retrieved from the Internet: URL:https://en.wikipedia.org/w/index.php?title=Moving_average&oldid=720021637 [retrieved on Jul. 21, 2017] the whole document.

* cited by examiner

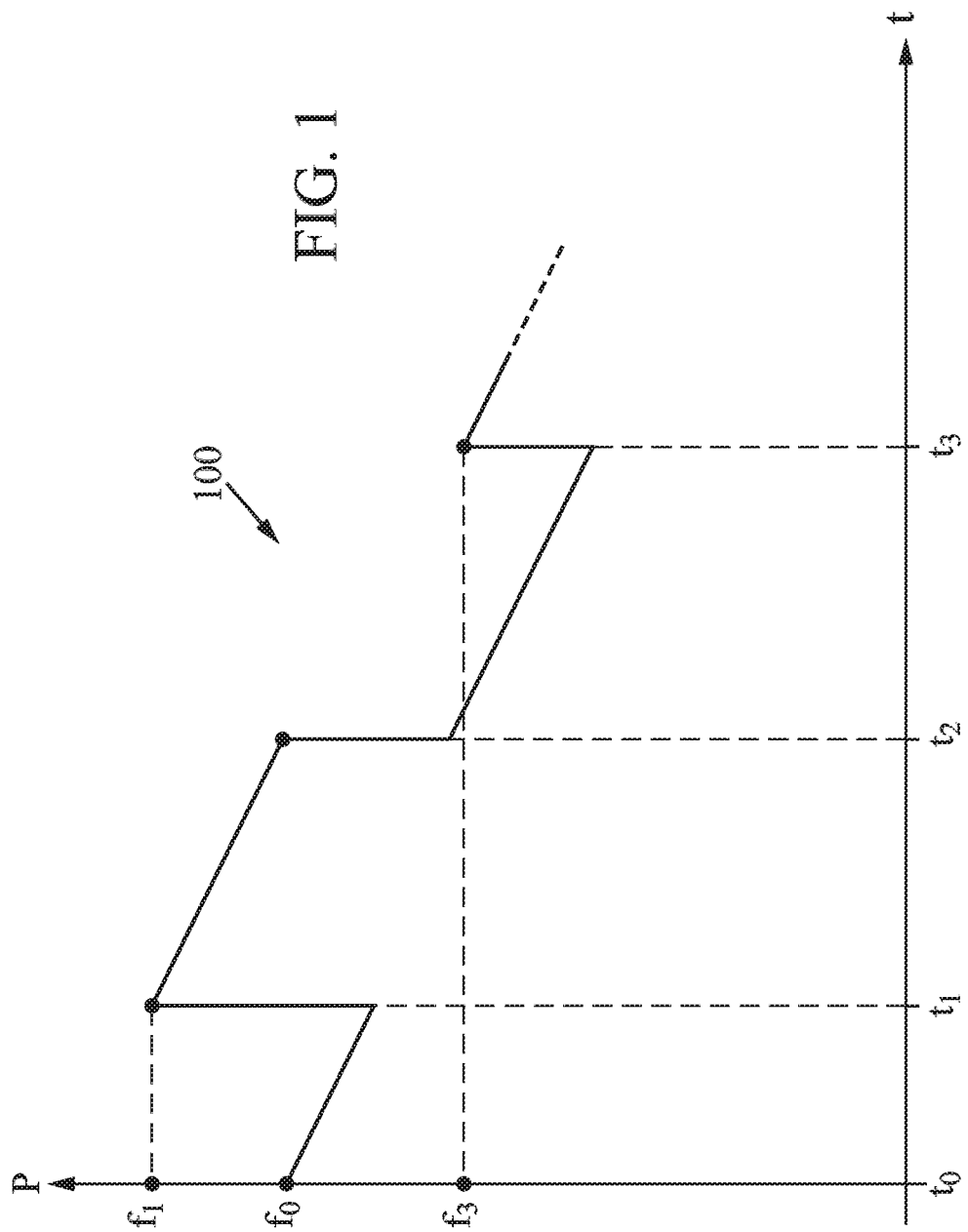

US 10,748,073 B2

METHOD AND DEVICE FOR ASSOCIATING A STATE TO A NEW VALUE OUTPUT BY A DRIFTING SENSOR

BACKGROUND OF THE DISCLOSURE

The present invention relates to the domain of the sensors and especially to the domain of the use of a sensor while its value(s) may slightly drift.

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section. Furthermore, all embodiments are not necessarily intended to solve all or even any of the problems brought forward in this section.

Normally, when using a sensor, the users may expect that the output value may be constant if the detected characteristics are constant/are identical. For instance, for a pressure sensor, if the pressure to be detected is constant at 2 bars, it may be expected that the output value of the sensor is constant (e.g. 128 for 2 bars, 64 for 1 bar, 32 for 0.5 bars, etc.).

Nevertheless, this is not always the case.

Due to some technologies used for some sensors, the output value may slightly drift: the output value (e.g. numerical) may be 128 for 2 bars at a time $t_0$, between 115 and 120 for 2 bars at a time $t_0+2$ h, etc.

Therefore, when it should be determined whether the output value represents a given state (e.g. a "high" value of the sensor may be associated with the state of the presence of a user on a pressure sensor, a "low" value of the sensor may be associated with the state of non-presence of a user on a pressure sensor) it may be difficult to determine in which state the sensor is.

For instance, in the example of FIG. 1, the output value of a pressure sensor is represented by the curve 100. For instance, this pressure sensor is designed to detect if a user is on a bed (state: presence of the user or "high" state) or no in its bed (state: non-presence of the user or "low" state). Even if this example has only two different states, it is possible to generalize this example to any number of states (e.g. a motion sensor which has three states: one state for "no movement", one state for "walking", one step for "running").

At $t_0$, the output value of the pressure may be $p_0$ which is, at that time $t_0$, associated with the low state. Between time $t_0$ and $t_1$, the output value of the sensor may decrease (due for instance to leaks). At time $t_1$, it is apparent, due to the sudden change of the output value up to $p_1$, that a person is present in the bed (high state). One may detect that this is a "high state" as the pressure $p_1$ is greater than $p_1$. Between time $t_1$ and $t_2$, the output value of the sensor may decrease (same reason(s) as above). At time $t_2$, it is apparent, due to the sudden change of the output, that the person has left (low state). Between time $t_2$ and $t_3$, the output value of the sensor may decrease (same reason(s) as above). At time $t_3$, it is apparent, due to the sudden change of the output value up to $p_3$, that a person is present in the bed (high state). Nevertheless, it is noted that $p_3$ is less than $p_0$. Therefore, if the value of $p_0$ is used as a reference of the low state, it may induce incorrect detections/determination of the state.

In addition, even if a human looking at the curve 100 of FIG. 100 may "visually" detect the "sudden change" at time $t_1$, $t_2$ or $t_3$, it may be difficult to algorithmically determine these changes of state, especially if the curve 100 has a lot of noise due to imperfections of the sensors, due to variations of temperature or due to variations of pressure.

Thus, there is a need for accurately determining various states based on a sensor whose output value may drift in time, with possibility noisy conditions.

Most of the time in the prior art, only one state (i.e. a normal state) may be determined. The drifting of the sensor is determined by computing a running average or sliding window average of the value of the sensor. This process assumes that, most of the time, the sensor detects a "normal state": this is the reason a simple average may provide a satisfactory result in this specific situation. Nevertheless, if a plurality of states may be detected with important probabilities (e.g. three states may be detected with a respective probability rating of 30%, 30% and 40%), it is not possible to perform a simple mean.

In addition, the memory of the device which should perform such determination could be limited. Therefore, the process used may limit the memory used for said determination.

SUMMARY OF THE DISCLOSURE

The invention relates to a method of associating at least one state in a plurality of states to a new value output by a drifting sensor, the method comprising:
 /a/ receiving a signal from the sensor, said signal comprising a plurality of values;
 /b/ clustering the values of said signal into a number of clusters equal to the number of the plurality of states, each cluster being associated with a respective state in the plurality of states;
 /c/ for the new value of the signal, associating at least one state in said plurality of states or a probability rating representing the probability to be associated with one state in said plurality of states for said new value of the signal, the associated state or the associated probability rating being determined based on at least distances of said new value of the signal to respective clusters.

The received signal may be a part of a more global signal. For instance, the received signal may be the last x seconds of a longer signal (sliding window).

Thanks to this method, it is possible to set dynamically the values of the states of the signal (e.g. the person is sleeping, the person is walking, the person is running), even if the sensor outputting the signal is drifting.

By clustering the signal, it is possible to avoid assuming any state of the signal before processing it (e.g. no need to associate to a new value a state so that an average value of the state is computed for this state).

The distance of step /c/ may be a mathematical difference (absolute value) of the new value and the barycenter value of each cluster.

In addition, prior to step /b/, the signal may be compressed into a compressed signal having values, the values of the compressed signal being used as the values of the signal in step /b/.

The compressing may be an approximation of said signal by a piecewise constant function or staircase function.

The compressing may also comprise:
 /d/ initializing an average value to a first value of the signal,
 /e/ for each second value in a plurality of second values of the signal output after the first value from the sensor:
  /e1/ if a distance between the second value and the average value is greater than a predetermined threshold, storing the average value as the compressed value into a memory and setting the average value to the second value, /e2/ otherwise, updating the average value to a new average value as a function of the second value and the average value.

Normally, the first value of the signal may be a value output by the sensor before all second values.

In addition, it may be usual to iterate step /e/ for each second value in the order of the output by the sensor.

Test /e1/ creates a new compressed value for the signal if the new value is "too" different from the previously computed compressed value (i.e. the average value).

Test /e2/ updates the previously computed compressed value (i.e. the average value) if the previous tests are not matched. This updating may take into account the average value weighted by the number of second points used (e.g. /e/ is executed N times since the last storage, then this number would be N) and the new value. These last two values may be added and divided by N+1.

Moreover, in the step /e/ and prior to the test /e2/, another test is executed:

/e3/ if a number of second values used to determine the average value is greater than a predetermined threshold, setting the average value to the second value.

Therefore, the test /e2/ is executed only both tests /e1/ and /e3/ fail.

Test /e3/ creates a new compressed value for the signal if no important change in the signal (i.e. greater than the predetermined threshold) has been detected since a predetermined period of time (i.e a predetermined number of second points). This new creation is motivated by the fact that, if a too great number is used to compute the average value, this average value may be non-representative of the signal.

In a specific embodiment, in test /e3/, storage of the average value into a memory may be performed prior to setting the average value to the second value.

By storing the average value in step /e3/, the compressed value of the signal may be stored. If no storage is performed (which is also possible), it is equivalent to set the value of the compressed signal to the new average value for the period of time extending from the last storage to the current second point.

In step /e/, the average value may be stored along a number of second values used for the determination of the average value after a previous storage of the average value.

The storage of the number of second values used for the determination of the average value may be useful for weighting the clustering or for weighting the values of the cluster in the determination of its barycenter.

In a given embodiment, each of the second value may be associated with a respective time/timestamp, and in step /e/, the average value may be stored along a minimum time among all the times associated with a second value used for the determination of the average value after a previous storage of the average value.

In addition, the clustering of step /b/ may comprise the use of a k-means algorithm or the use of an unsupervised clustering algorithm.

The clustering of step /b/ may also comprises a weighting of the values of the signal by a number of second values used for the determination of the average value after a previous storage of the average value.

Step /c/ may comprise the use of a forward algorithm (see "An Efficient Forward Backward Algorithm for an Explicit-Duration Hidden Markov Model" at hisashikobayashi.com/papers/Hidden%20Semi%20Markov%20Model%20(HSMM)%20and%20Computational%20Algorithms/An%20Efficient%20Forward-Backward%20Algorithm%20for%20an%20Explicit%20Duration%20Hidden%20Markov%20Model.pdf) or the use of a decision tree (see "Classification and Regression Trees" at http://cda.psych.uiuc.edu/multivariate_fall_2013/systat_cartr_manual.pdf).

A second aspect relates to a device comprising:
- a sensor for outputting a signal, said signal comprising a plurality of values;
- a memory;
- a circuit for clustering the values of said signal into a number of clusters equal to the number of a plurality of states, each cluster being associated with a respective state in the plurality of states;
- a circuit for associating at least one state in said plurality of states or a probability rating representing the probability to be associated with one state in said plurality of states for a new value of the signal, the associated state or the associated probability rating being determined based on at least distances of said new value of the signal to respective clusters.

A third aspect relates to a computer program product comprising a computer readable medium, having thereon a computer program comprising program instructions. The computer program is loadable into a data-processing unit and adapted to cause the data-processing unit to carry out the method described above when the computer program is run by the data-processing unit.

Other features and advantages of the method and apparatus disclosed herein will become apparent from the following description of non-limiting embodiments, with reference to the appended drawings.

BRIEF DESCRIPTION OF THE DRAWINGS

The present invention is illustrated by way of example, and not by way of limitations, in the figures of the accompanying drawings, in which like reference numerals refer to similar elements and in which:

FIG. 1 is an example of a drifting output value of a sensor;

DETAILED DESCRIPTION OF THE DISCLOSURE

FIG. 2 is an example of "compression" of a signal into a piecewise function in a possible embodiment of the invention.

A signal output by a sensor is often a high frequency sampled set of values. For instance, said of values may be derived from a continuous signal after a sampling of 5 Hz to 50 Hz or may be generated by measures made by the sensor at 5 Hz to 50 Hz.

Therefore, the signal may comprise a large number of values and it can be a problem for electronic devices with limited computing capabilities and/or memory capabilities.

Most of the time for small electronic devices (e.g. home connected devices), the whole signal cannot be stored in a memory and the manipulation of said signal may be difficult.

In order to avoid storing unneeded information, the following process may be executed.

Figure 2B:
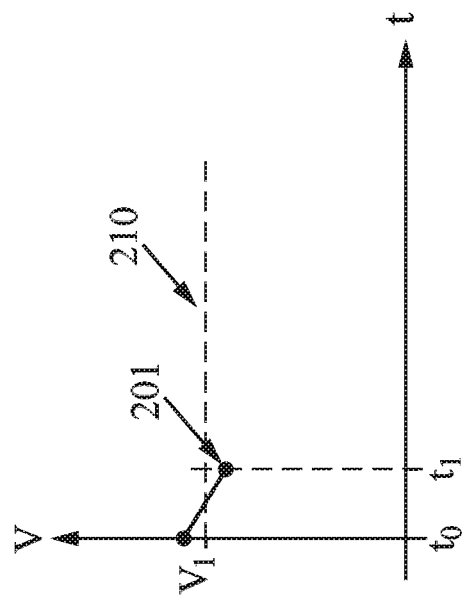
FIG. 2b is an example of a "compression" of a signal into a piecewise function in a possible embodiment of the invention at a second time after the first time.
Figure 2D:
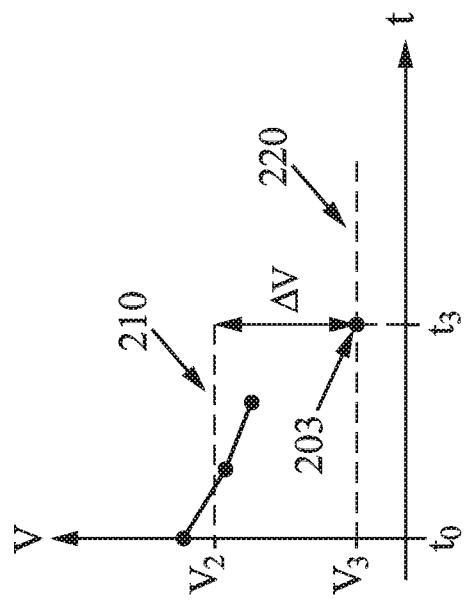
FIG. 2d is an example of a "compression" of a signal into a piece wise function in a possible embodiment of the invention at a fourth time after the third time.
Figure 2A:
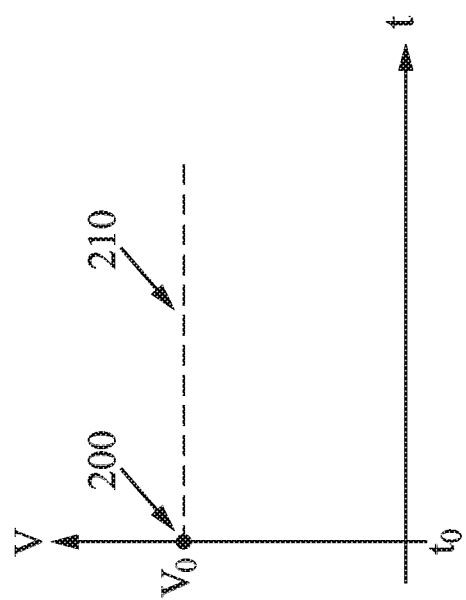
FIG. 2a is an example of a "compression" of a signal into a piecewise function in a possible embodiment of the invention at a first time.

Upon receiving a new value $v_{200}$ (FIG. 2(a), 200) of the signal at time $t_0$, it is determined if an average value 210 (namely $\overline{V}$) is defined.

If not, the average value is initialized: the average value $\overline{V}$ is then defined to a value equal to the new value $V_{200}$ of the signal (FIG. 2(a)) i.e. $\overline{V}=V_0=V_{200}$.

In addition, a number of point $N_{points}$ is initialized to 1 and a starting time $t_{start}$ is set to $t_0$.

Upon receiving a new value $v_{201}$ (FIG. 2(b), 201) of the signal at time $t_1$, and if the average value $\overline{v}$ defined/initialized, said average value V is updated to a new value $V_1$ function of the old average value $\overline{V}$ and the new value $V_{201}$. For instance, it is possible to compute:

$$\overline{V} \leftarrow \frac{\overline{V} \cdot N_{points} + V_{201}}{N_{points} + 1}$$

In addition, it is possible to update the number of points:

$$N_{points} \leftarrow N_{points} + 1$$

Figure 2C:
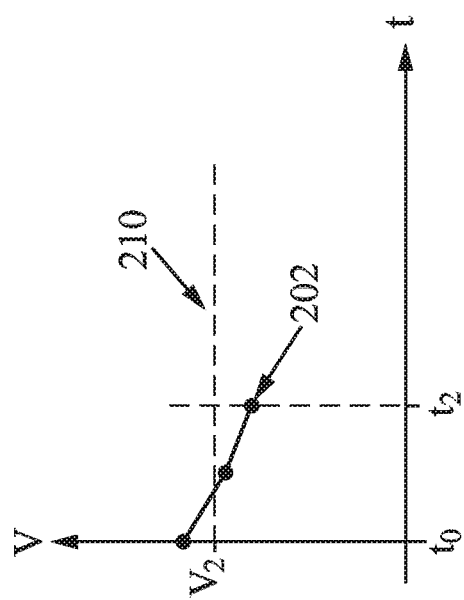
FIG. 2c is an example of a "compression" of a signal into a piecewise function in a possible embodiment of the invention at a third time after the second time.

Upon receiving a new value $V_{302}$ (FIG. 2(c), 202) of the signal at time $t_2$, the same process described in relation of FIG. 2(b) is executed: as the average value $\overline{V}$ is defined, said average value $\overline{V}$ is updated to a new value $V_2$ function of the old average value $\overline{V}$ and the new value $V_{202}$. For instance, it is possible to compute:

$$\overline{V} \leftarrow \frac{\overline{V} \cdot N_{points} + V_{202}}{N_{points} + 1}$$

In addition, it is possible to update the number of points:

$$N_{points} \leftarrow N_{points} + 1$$

Nevertheless, it is possible to add further conditions for the updating of the average value $\overline{V}$.

For instance, if the number of points $N_{points}$ is greater than a predetermined threshold, the set of the average value $\overline{V}$, the starting $timt_{start}$ and the number of points $N_{points}$ may be stored in a memory to represent the compressed signal.

Then, the average value $\overline{V}$ may be unset (or set to "undefined").

To further compress the signal, it is also possible to skip the storing step (for this condition) and only set the average value $\overline{V}$ to the next received value of the signal/the last received value of the signal without unsetting the average value $\overline{V}$: by doing so, the starting time $t_{start}$ and the number of points $N_{points}$ are kept without being resetting. It is equivalent to setting all the previous "pieces" of the compressed piecewise signal to the new current average value $\overline{V}$ (e.g. searching all the consecutive and previous storage in the memory where the difference between the stored average value and the current average value is below a predetermined threshold and reset all the found stored average value to the current average value).

Alternatively or in addition, if a distance between the new value $V_{203}$ (FIG. 2(d), 203) of the signal at time $t_3$ and the average value $\overline{V}$ is greater than a predefined threshold (e.g. if $\Delta V=|V_{203}-\overline{V}|$ is greater than a predefined threshold), the set of the average value $\overline{V}$, the starting time $t_{start}$ and the number of points $N_{points}$ may be stored in a memory to represent the compressed signal.

Then, the average value $\overline{V}$ may be unset (or set to "undefined"). The value $V_{203}$ is thus processed as the value $V_{230}$ in FIG. 2(a) and a new average value $\overline{V}$ is created (220) equal to $V_{203}$.

Therefore, the "compressed" signal comprises a number of "pieces" of piecewise signal, each piece being defined by a start (e.g. a starting time $t_{start}$), a length (e.g. a number of points $N_{points}$) and a value (e.g. an average value $\overline{V}$).

The pseudo-code for this compressing may be:

```
foreach (new_signal_value) then
    if (isset(average_value)) then
        if (|new_signal_value-average_value|>thres_val1) then
            store(average_value, nb_value, time_start) ;
            average_value = new_signal_value ;
            nb_value = 1 ;
            time_start = get_time(new_signal_value) ;
        else
            if (nb_value>thres_val2) then
                average_value = new_signal_value ;
            else
                average_value =
                    (new_signal_value+average_value*
                        nb_value)/(nb_value+1) ;
                nb_value ++ ;
            endif
        end if
    else
        average_value = new_signal_value ;
        nb_value = 1 ;
        time_start = get_time(new_signal_value) ;
    end if
end if
```

Alternatively, the pseudo code may be also:

```
foreach (new_signal_value) then
    if (isset(average_value)) then
        if (|new_signal_value-average_value|>thres_val1) then
            store(average_value, nb_value1, time_start) ;
            average_value = new_signal_value ;
            nb_value1 = 1 ;
            nb_value2 = 1 ;
            time_start = get_time(new_signal_value) ;
        else
            if (nb_value2>thres_val2) then
                average_value = new_signal_value ;
                nb_value2 = 1 ;
            else
                average_value =
                    (new_signal_value+average_value*
                        nb_value2)/(nb_value2+1) ;
                nb_value1 ++ ;
                nb_value2 ++ ;
            endif
        end if
    else
        average_value = new_signal_value ;
        nb_value1 = 1 ;
        nb_value2 = 1 ;
        time_start = get_time(new_signal_value) ;
    end if
end if
```

In the latter pseudo code, the variable nb_value has been split into two variables i.e. nb_value1 and nb_value2. Indeed, nb_value1 represents the number of values used since the last storing of the average value while nb_value2 represents the number of values used since the resetting of the average value. This splitting increases the impact of a new value on the average value.

Figure 3:
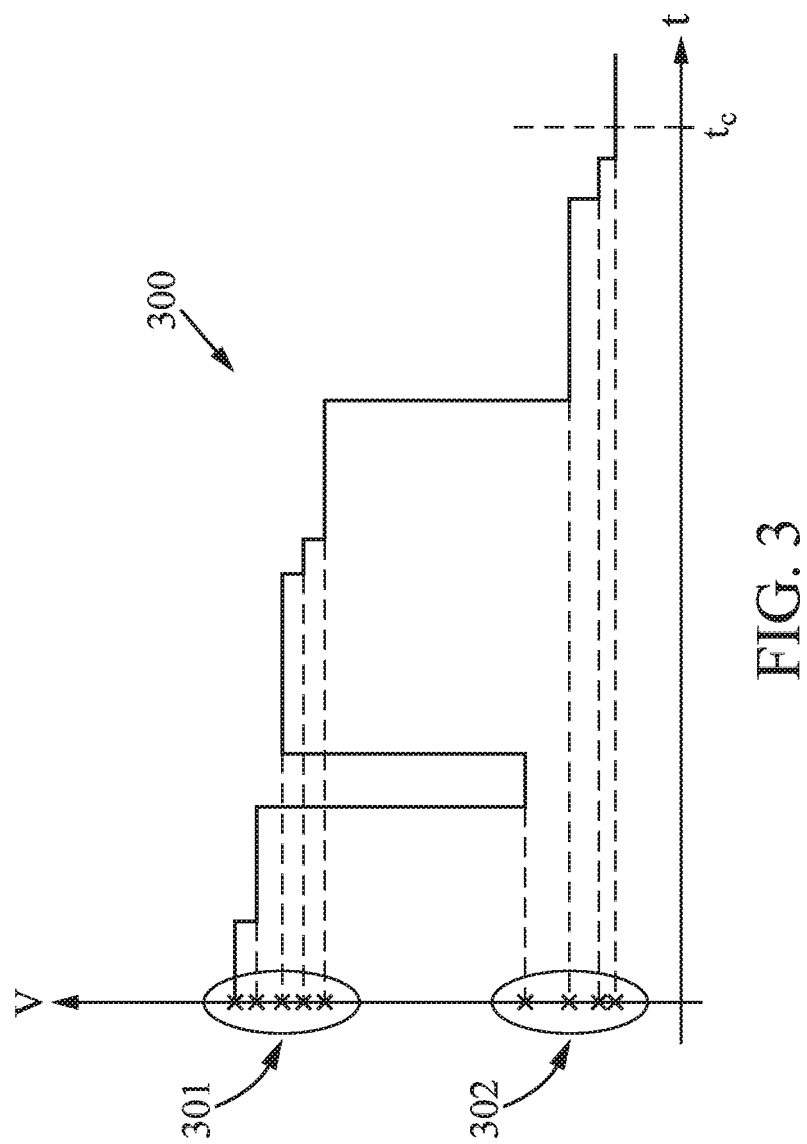
FIG. 3 is an example of "clustering" of a signal in a possible embodiment of the invention.

FIG. 3 is an example of "clustering" of a signal in a possible embodiment of the invention.

"Cluster analysis" or "clustering" is the task of grouping a set of objects (here the values of the signal) in such a way that objects in the same group (called a cluster) are "closer" to each other than to those in other groups (clusters). The number of clusters may be set to any number greater or equal to 2. "Closer" may be understood as "closer according to a given mathematical distance". Any mathematical distance may be used.

This clustering is possible on the raw signal (i.e. the high frequency sampled signal) but it is advantageous to perform this clustering on a compressed signal (for instance, based on the method described in FIG. 2) as the memory and the processing means of the device may be limited.

If the signal is not compressed (i.e. the signal is sampled at a given/constant frequency), a clustering algorithm may be applied to the values of the signal without weighting.

If the signal is compressed, a clustering algorithm may be applied to the values of the compressed signal (i.e. ∇ according to FIG. 2) with a weighting (i.e. each current point may be weighted by the length/the number of points $N_{points}$ associated with the current point).

Many clustering algorithm may be used such as an unsupervised clustering algorithm (e.g. k-means algorithm, see "Algorithm AS 136: A K-Means Clustering Algorithm" at http://www.labri.fr/perso/bpinaud/userfiles/downloads/hartigan_1979_kmeans.pdf).

For instance, if two clusters are searched, a clustering algorithm may determine that the values of signal 300 may be split into two clusters 301 and 302.

It is advantageous to use a clustering algorithm that supports update mechanisms: when the clusters are determined and when a new value is received in the signal at a time $t_c$, the cluster may be easily updated without re-computing the whole clusters.

For instance, when a point of the signal is newly received, this point may be associated with the closest cluster (e.g. the cluster whose barycenter is the closest).

Figure 4:
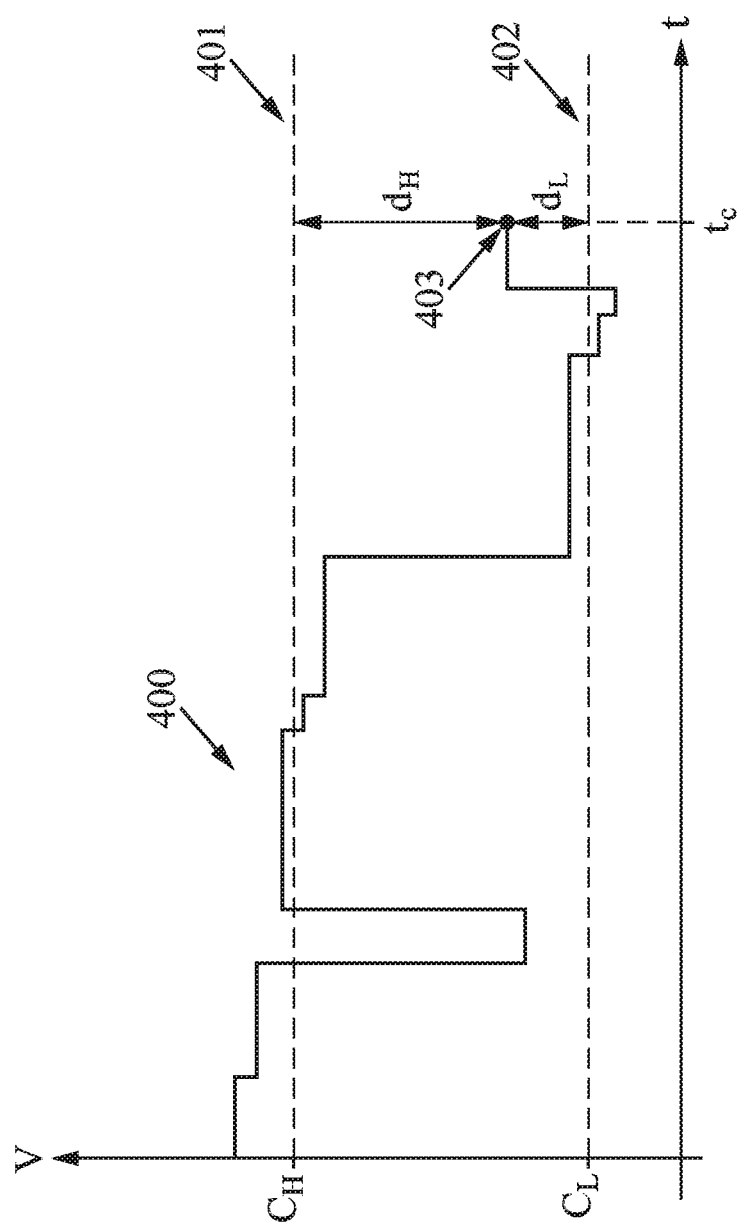
FIG. 4 is an example of a determination of a cluster associated with a new event in the signal in a possible embodiment of the invention.

FIG. 4 is an example of a determination of a cluster associated with a new event in the signal in a possible embodiment of the invention.

In said example, it is assumed that two clusters have been previously determined and that $C_H$ is a barycenter of one of the clusters and that $C_L$ is a barycenter of the other cluster.

Upon the reception of a new point 403 of the signal 400 at a time it is determined the distance $d_H$ of said point 403 to $C_H$ (line 401) and the distance $d_L$ of said point 403 to $C_L$ (line 402).

Based on said determined distances (and possible other parameters), it is possible to compute a value representing the probability the new value 403 represents an event of the first cluster (e.g. the user is present in the bed in the case the sensor is detecting a pressure in the bed) or of the second cluster (e.g. the user is not present in the bed in the case the sensor is detecting a pressure in the bed). This probability may be a binary probability (e.g. 0 or 1 only) or a "more complex" probability (e.g. a real value between 0 and 1).

For instance, the probability $P_H$ that the new value 403 represents an event of the first cluster (whose barycenter is $C_H$) may be:

$$P_H = \frac{d_H}{d_H + d_L}$$

or $$P_H = intval\left(\frac{d_H}{d_H + d_L}\right)$$

where intval represents a function that returns the closest integer value.

$P_H$ may also be function of the previous values of the signal.

In addition, $P_H$ may be determined based on a learning process (e.g. with a neural network for instance). Therefore, a decision tree may be used to limit the use of memory during the determination of $P_H$. Hysteresis thresholding or forward algorithm may also be used for such determination.

Figure 5:
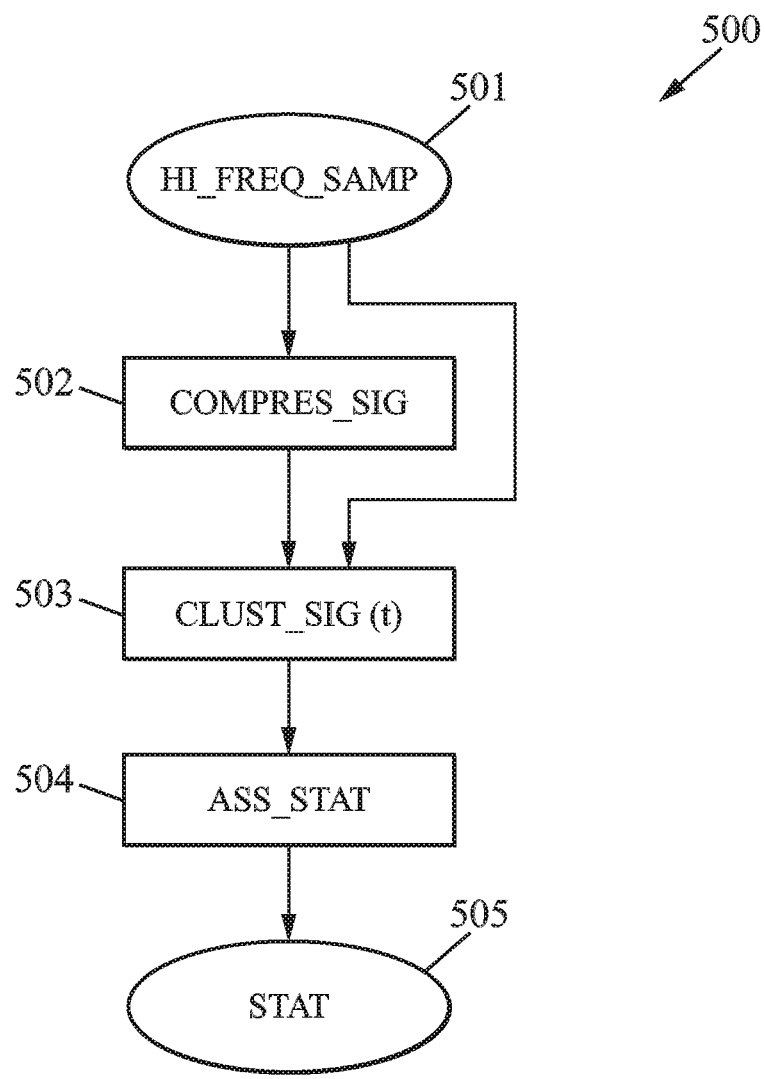
FIG. 5 is a flow chart describing a possible embodiment of the present invention.

FIG. 5 is a flow chart describing a possible embodiment of the present invention. Part of this flow chart can represent steps of an example of a computer program which may be executed by an electronic device.

Upon receiving 501 a signal (e.g. a high frequency sampled signal), it is possible to compress it (step 502) as detailed in relation of FIG. 2. The reception of said signal may be in one "block" (i.e. receiving a single set of data containing the whole signal) but may also be "on the fly" (i.e. receiving the data as soon as it is generated by the sensor).

The compression (step 502) is optional. The signal may be already compressed or it has been determined that the memory/processing means of the devices are not a limit for processing the data.

It is thus possible to compute (step 503) two or more clusters based on the signal (step 503) as detailed in relation of FIG. 3.

For each point of the signal (and especially the last received point if the signal is received on the fly), it is possible to determine a probability rating (step 504) as detailed in relation of FIG. 4.

Finally, this probability rating (505) may be output. Alternatively or in parallel, an indication to which state (i.e. cluster) the point is related may be output.

Figure 6:
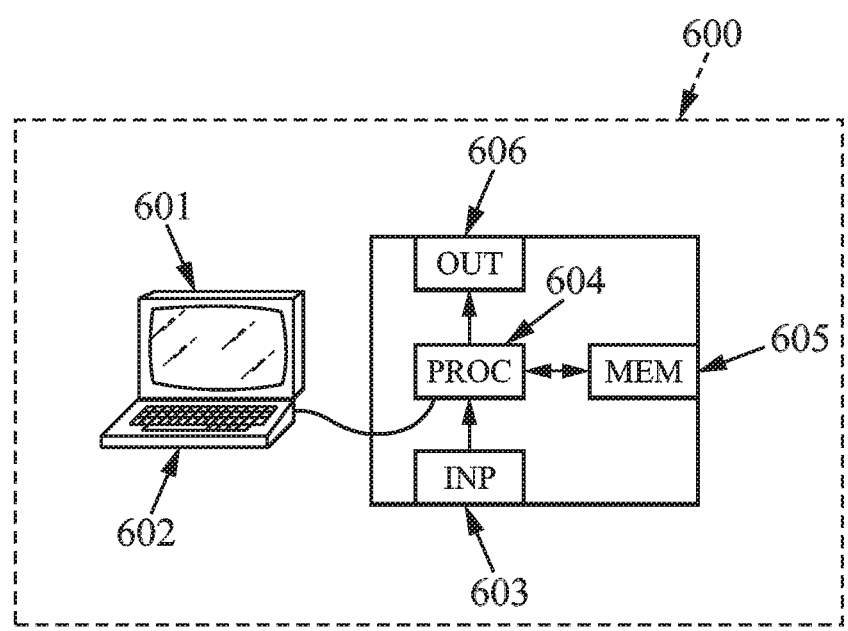
FIG. 6 is a possible embodiment for a device that enables the present invention.

FIG. 6 is a possible embodiment for a device that enables the present invention.

In this embodiment, the device 600 comprise a computer, this computer comprising a memory 605 to store program instructions loadable into a circuit and adapted to cause circuit 604 to carry out the steps of the present invention when the program instructions are run by the circuit 604.

The memory 605 may also store data and useful information for carrying the steps of the present invention as described above.

The circuit 604 may be for instance:

- a processor or a processing unit adapted to interpret instructions in a computer language, the processor or the processing unit may comprise, may be associated with or be attached to a memory comprising the instructions, or
- the association of a processor/processing unit and a memory, the processor or the processing unit adapted to interpret instructions in a computer language, the memory comprising said instructions, or an electronic card wherein the steps of the invention are described within silicon, or a programmable electronic chip such as a FPGA chip (for « Field-Programmable Gate Array » ).

This computer comprises an input interface 603 for the reception of the signal according to the invention and an output interface 606.

To ease the interaction with the computer, a screen 601 and a keyboard 602 may be provided and connected to the computer circuit 604.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in being a reference to the plural and vice versa.

A person skilled in the art will readily appreciate that various parameters disclosed in the description may be modified and that various embodiments disclosed may be combined without departing from the scope of the invention.

The invention claimed is:

1. A method of associating at least one state in a plurality of states to an output of a drifting sensor, the method comprising:
   generating a continuous signal by the sensor based on a measurement while undergoing drift, said drifting sensor is a pressure sensor;
   receiving the continuous signal from the sensor by a processor, said continuous signal comprising a plurality of measured values;
   compressing the received continuous signal into a compressed signal having compressed values, wherein the compressed signal is a piecewise constant signal and compressing the received continuous signal comprises:
   initializing an average value to a first value of the continuous signal; and
   for each second value in a plurality of second values of the continuous signal output after the first value from the sensor:
   if a distance ($\Delta V$) between the second value and the average value is greater than a predetermined threshold, storing the average value as a compressed value into a memory and setting the average value to the second value,
   otherwise, updating the average value to a current average value as a function of the second value and the average value;
   clustering the compressed signal into a number of clusters equal to the number of the plurality of states, each cluster being associated with a respective state in the plurality of states; and
   for a current value of the continuous signal, associating at least one state in said plurality of states or a probability rating representing the probability to be associated with one state in said plurality of states for said current value of the continuous signal, the associated state or the associated probability rating being determined based on at least distances ($d_H$, $d_L$) of said current value of the continuous signal to respective clusters.

2. The method according to claim 1, wherein, prior to updating the average value to a current average value as a function of the second value and the average value, another test is executed:
   if a number of second values used to determine the average value is greater than a predetermined threshold, setting the average value to the second value.

3. The method according to claim 2, wherein, when setting the average value to the second value, storage of the average value into a memory is performed prior to setting the average value to the second value.

4. The method according to claim 1, wherein the average value is stored along a number of second values used for the determination of the average value after a previous storage of the average value.

5. The method according to claim 1, wherein each of the second values is associated with a respective time, and
   wherein the average value is stored along a minimum time among all the times associated with a second value used for the determination of the average value after a previous storage of the average value.

6. The method according to claim 1, wherein the clustering comprises a weighting of the values of the compressed signal by a number of second values used for the determination of the average value after a previous storage of the average value.

7. The method according to claim 1, wherein the clustering comprises the use of a k-means algorithm.

8. The method according to claim 1, wherein the clustering comprises the use of an unsupervised clustering algorithm.

9. The method according to claim 1, wherein the associating at least one state comprises the use of a forward algorithm.

10. The method according to claim 1, wherein associating at least one state comprises the use of a decision tree.

11. A non-transitory computer readable storage medium, having stored thereon a computer program comprising program instructions for associating at least one state in a plurality of states to an output of a drifting sensor, the computer program being loadable into a data-processing unit and adapted to cause the data-processing unit to carry out, when the computer program is run by the data-processing device:
    generating a continuous signal by the sensor based on a measurement while undergoing drift, said drifting sensor is a pressure sensor;
    receiving the continuous signal from the sensor, said continuous signal comprising a plurality of values;
    compressing the received continuous signal into a compressed signal having compressed values, wherein the compressed signal is a piecewise constant signal and compressing the received continuous signal comprises:
    initializing an average value to a first value of the continuous signal; and
    for each second value in a plurality of second values of the continuous signal output after the first value from the sensor:
    if a distance ($\Delta V$) between the second value and the average value is greater than a predetermined threshold, storing the average value as a compressed value into a memory and setting the average value to the second value,
    otherwise, updating the average value to a current average value as a function of the second value and the average value;
    clustering the compressed signal into a number of clusters equal to the number of the plurality of states, each cluster being associated with a respective state in the plurality of states; and
    for a current value of the continuous signal, associating at least one state in said plurality of states or a probability rating representing the probability to be associated with one state in said plurality of states for said current value of the continuous signal, the associated state or the associated probability rating being determined based on at least distances ($d_H$, $d_L$) of said current value of the continuous signal to respective clusters.

12. The non-transitory computer readable storage medium of claim 11, wherein prior to updating the average value to a current average value as a function of the second value and the average value, another test is executed:

if a number of second values used to determine the average value is greater than a predetermined threshold, setting the average value to the second value, wherein when setting the average value to the second value, storage of the average value into a memory is performed prior to setting the average value to the second value.

13. The non-transitory computer readable storage medium of claim 11, wherein the average value is stored along a number of second values used for the determination of the average value after a previous storage of the average value.

14. The non-transitory computer readable storage medium of claim 11, wherein each of the second values is associated with a respective time, and wherein the average value is stored along a minimum time among all the times associated with a second value used for the determination of the average value after a previous storage of the average value.

15. The non-transitory computer readable storage medium of claim 11, wherein the clustering comprises a weighting of the values of the compressed signal by a number of second values used for the determination of the average value after a previous storage of the average value.

16. A device comprising:

a pressure sensor for outputting a continuous signal, wherein the pressure sensor is undergoing drift and said continuous signal comprising a plurality of values;

a memory;

a circuit for compressing the received continuous signal into a compressed signal having compressed values, wherein the compressed signal is a piecewise constant signal and compressing the received continuous signal comprises:

initializing an average value to a first value of the continuous signal; and for each second value in a plurality of second values of the continuous signal output after the first value from the sensor:

if a distance ($\Delta V$) between the second value and the average value is greater than a predetermined threshold, storing the average value as a compressed value into a memory and setting the average value to the second value, otherwise, updating the average value to a current average value as a function of the second value and the average value;

a circuit for clustering the values of said compressed signal into a number of clusters equal to the number of a plurality of states, each cluster being associated with a respective state in the plurality of states; and a circuit for associating at least one state in said plurality of states or a probability rating representing the probability to be associated with one state in said plurality of states for a current value of the compressed signal, the associated state or the associated probability rating being determined based on at least distances of said current value of the compressed signal to respective clusters.

17. The device of claim 16, wherein the average value is stored along a number of second values used for the determination of the average value after a previous storage of the average value.

18. The device of claim 16, wherein each of the second values is associated with a respective time, and wherein the average value is stored along a minimum time among all the times associated with a second value used for the determination of the average value after a previous storage of the average value.

19. The device of claim 16, wherein the clustering comprises a weighting of the values of the compressed signal by a number of second values used for the determination of the average value after a previous storage of the average value.

* * * * *

UNITED STATES PATENT AND TRADEMARK OFFICE
CERTIFICATE OF CORRECTION

PATENT NO. : 10,748,073 B2
APPLICATION NO. : 15/164329
DATED : August 18, 2020
INVENTOR(S) : Paul Edouard, Riu-Yi Yang and Cedric Hutchings Page 1 of 1

It is certified that error appears in the above-identified patent and that said Letters Patent is hereby corrected as shown below:

On the Title Page

Please correct the inventor's name:
Riu-Yi Yang
To:
-- Rui-Yi Yang --

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*